(12) United States Patent  
Ikushima

(10) Patent No.: US 8,840,953 B2  
(45) Date of Patent: Sep. 23, 2014

(54) METHOD OF ADJUSTING NOZZLE CLEARANCE OF LIQUID APPLICATION APPARATUS, AND LIQUID APPLICATION APPARATUS

(75) Inventor: Kazumasa Ikushima, Mitaka (JP)

(73) Assignee: Musashi Engineering, Inc., Tokyo (JP)

( * ) Notice: Subject to any disclaimer, the term of this patent is extended or adjusted under 35 U.S.C. 154(b) by 1317 days.

(21) Appl. No.: 12/095,568

(22) PCT Filed: Nov. 30, 2006

(86) PCT No.: PCT/JP2006/324401  
§ 371 (c)(1),  
(2), (4) Date: Sep. 4, 2008

(87) PCT Pub. No.: WO2007/064036  
PCT Pub. Date: Jun. 7, 2007

(65) Prior Publication Data  
US 2010/0175759 A1 Jul. 15, 2010

(30) Foreign Application Priority Data

Nov. 30, 2005 (JP) ................................. 2005-345104

(51) Int. Cl.  
*C23C 16/52* (2006.01)  
*C23C 14/54* (2006.01)

(52) U.S. Cl.  
USPC ................................. 427/8; 427/10; 356/4.01

(58) Field of Classification Search  
CPC ............... G01B 11/00; G01B 2290/00; G01B 11/2518; G01B 21/047  
USPC ...................................................... 427/8, 10  
See application file for complete search history.

(56) References Cited

U.S. PATENT DOCUMENTS

| | | | |
|---|---|---|---|
| 2004/0099061 A1 * | 5/2004 | Jonsson | 73/723 |
| 2004/0131758 A1 * | 7/2004 | Jung et al. | 427/8 |
| 2005/0045653 A1 * | 3/2005 | Tanaka et al. | 222/1 |
| 2007/0227227 A1 | 10/2007 | Ikushima | |

FOREIGN PATENT DOCUMENTS

| | | |
|---|---|---|
| JP | 2-52742 | 2/1990 |
| JP | 5-15819 | 1/1993 |
| JP | 2005-58830 | 3/2005 |
| JP | 2005-66391 | 3/2005 |

OTHER PUBLICATIONS

English language Abstract of JP 2005-58830, Mar. 10, 2005.  
English language Abstract of JP 2-52742, Feb. 22, 1990.  
English language Abstract of JP 5-15819, Jan. 26, 1993.  
English language Abstract of JP 2005-66391, Mar. 17, 2005.

* cited by examiner

*Primary Examiner* — Michael Cleveland  
*Assistant Examiner* — Austin Murata  
(74) *Attorney, Agent, or Firm* — Greenblum & Bernstein P.L.C.

(57) ABSTRACT

A method of adjusting a clearance between a nozzle and a work to a desired value in a liquid application apparatus wherein a liquid discharged from the nozzle is applied to the work, comprises (a) a distance measurement step of measuring, by using a non-contact distance sensor positioned in parallel with the nozzle, a distance from the non-contact distance sensor to a reference surface of a contact detection sensor detecting a contact of the nozzle front end with the reference surface opposite to the nozzle front end, (b) a nozzle contacting step of making contacts with the nozzle front end and the reference surface of the contact detection sensor to obtain a positional information of the nozzle, (c) a distance measurement step of measuring, by the non-contact distance sensor, a distance from the non-contact distance sensor to the work before applying the liquid to the work, and (d) a step of adjusting a nozzle clearance to a desired value based on the relative positional information between the nozzle and the non-contact distance sensor determined by the distance measurement step (a) and the nozzle contacting step (b), and the distance determined by the distance measurement step (c), thereby to enable the nozzle clearance adjustment based on accurate information of the relative position between the nozzle and the non-contact distance sensor in the nozzle clearance direction, which is less influenced by the work's windings, heaves or others.

18 Claims, 11 Drawing Sheets

Distance measurement step

Nozzle contacting step

Distance measurement step

Nozzle contacting step

Relative position adjusting step

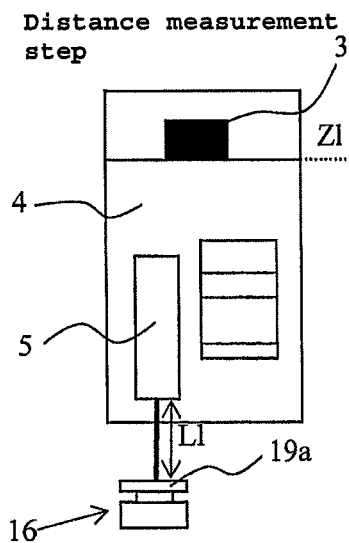
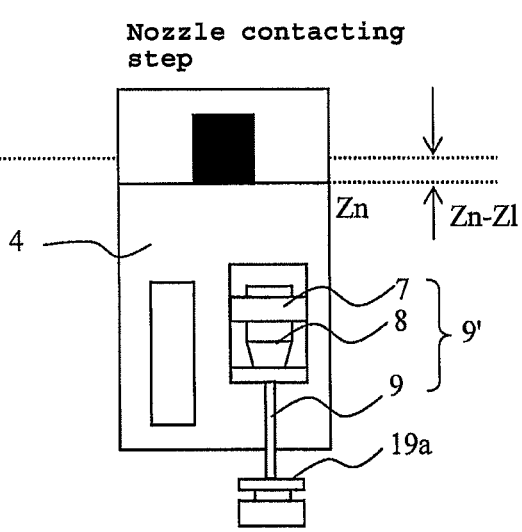
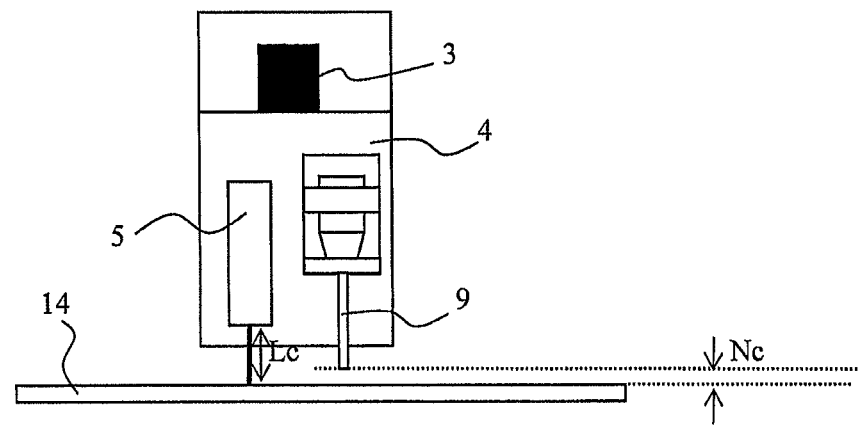

Distance measurement step

Nozzle contacting step

Relative position adjusting step 1

Relative position adjusting step 2

Distance measurement step

Nozzle contacting step

Relative position adjusting step 1

Relative position adjusting step 2

METHOD OF ADJUSTING NOZZLE CLEARANCE OF LIQUID APPLICATION APPARATUS, AND LIQUID APPLICATION APPARATUS

This application claims the priority of the Japanese Patent Application No. 2005-345104 filed in the Japanese Patent Office on Nov. 30, 2005, the entirety of which is incorporated by reference herein.

TECHNICAL FIELD

The present invention generally relates to a liquid application apparatus used in production of liquid crystal display, semiconductors, etc., and more particularly, to a method of adjusting, to a desired value, the nozzle clearance which is a distance from a discharge port of a nozzle of the liquid application apparatus to a substrate to which a liquid is to be applied (hereinafter referred to simply as "work") and a liquid application apparatus adapted so that the nozzle clearance is so adjustable.

BACKGROUND ART

Generally, the display panel of the liquid crystal display is produced by applying a sealing material or sealant in the form of a frame to a glass substrate, bonding another glass substrate to the sealed glass plate from above and filling liquid crystal into a space between the glass substrates.

The conventional sealant application apparatus includes a head section having a nozzle mounted thereon, and a work table on which a glass substrate (work) is to be placed. By moving the head section and the work table relatively to each other into a predetermined position, a sealant can be applied linearly in a desired form.

In such a sealant application apparatus, it is necessary to keep a constant nozzle clearance (distance between the nozzle and work) for an acceptable shape of the applied sealant. In case the surface height of the work is not constant, the distance to the work is measured with the use of a non-contact distance sensor mounted on the head section, and the head section and work table are adjusted in height for a constant nozzle clearance before application of a sealant.

More particularly, a non-contact distance sensor (laser displacement sensor) is mounted on the head section with the nozzle, laser light is emitted from the sensor to the work, reflected light from the work is detected by the sensor to measure the distance L from the non-contact distance sensor to the work and the head section and work table are moved until the distance L becomes constant, as shown in FIG. 11 for example.

In the above sealant application apparatus, when no sufficient amount of sealant remains any more in the reservoir, the reservoir itself is replaced or it is replaced along with the nozzle; and if the nozzle is clogged, it is replaced or a new nozzle is installed. In such a case, it is possible that the existing and new nozzles are different in shape from each other, fixing tools used for the existing and new nozzles are mechanically different from each other or the new nozzle is installed with accuracy different from that with which the existing nozzle was installed (which is called "case error"). Such a case error will possibly cause the nozzle and non-contact distance sensor to be misaligned with each other in the direction of the nozzle clearance (Z-axial direction).

Even if the nozzle clearance is adjusted for the distance measured by the non-contact distance sensor to be the same as that which was before the nozzle replacement, the inaccurate alignment between the nozzle and non-contact distance sensor makes it impossible to reproduce precisely the nozzle clearance which was before the nozzle replacement. Thus, since the sealant cannot be applied in desired form, the nozzle clearance has to be adjusted taking in consideration the Z-axial displacement between the discharge port of the nozzle and non-contact distance sensor each time the nozzle is replaced or a new one is installed.

To solve the above problem, there has been proposed a nozzle clearance adjusting method in which a measuring jig is placed on a work table, the distance over which the nozzle has to be moved until it touches the measuring jig is measured by an optical displacement gage (non-contact distance sensor) and the nozzle and optical displacement gage are aligned between them based on the measured distance to adjust the nozzle clearance (as disclosed in the Japanese Unexamined Patent Application No. H05-15819).

In the method disclosed in the above Japanese Unexamined Patent Application No. H05-15819, however, even if the distance measurement is made by the non-contact distance sensor with the discharge port of the nozzle put into touch with the measuring jig in case the surface of the measuring jig has an Z-directional error such as undulation, a position where the nozzle is put in touch with the measuring jig and a position where the distance is measured by the non-contact distance sensor are misaligned with each other. So, accurate information on the Z-axial relative position between the nozzle and non-contact distance sensor cannot be provided, and thus the nozzle clearance cannot accurately be adjusted.

Also, since the position where the nozzle is in touch with the measuring jig and the position where the measurement by the non-contact distance sensor is made are separated from each other, a slight inclination of the measuring jig will result in a large Z-axial misalignment and tremendous amounts of labor and cost are required for production of a high-precision measuring jig.

Further, in the Japanese Unexamined Patent Application No. H05-15819, when the nozzle is put into touch with the measuring jig, abutment of the nozzle causes the surface of the measuring jig to incur strain. While such strain is taking place, the distance measurement is made by the non-contact distance sensor. So, it is not possible to accurately measure the Z-axial alignment between the nozzle and measuring jig, and thus the nozzle clearance cannot be adjusted accurately.

Also, when the nozzle is put into touch with the measuring jig as above, it will possibly be damaged at the front end thereof, so that no acceptable sealant application can be assured.

It is an object of the present invention to overcome the above-mentioned drawbacks of the conventional art by providing a method of adjusting the nozzle clearance in a liquid application apparatus, in which the nozzle and non-contact distance sensor can accurately be positioned relatively to each other in the direction of the nozzle clearance and the nozzle clearance can accurately be adjusted under less influence of undulation or inclination of the work, and a liquid application apparatus adapted so that the nozzle clearance is so adjustable.

DISCLOSURE OF THE INVENTION

The present invention proposes a method of adjusting a nozzle clearance between a nozzle and a work to a desired value in a liquid application apparatus wherein a liquid discharged from the nozzle is applied to the work, comprising;

(a) a distance measurement step of measuring, by using a non-contact distance sensor positioned in parallel with the nozzle, a distance from the non-contact distance sensor to a reference surface of a contact detection sensor detecting a contact of the nozzle front end with the reference surface opposite to the nozzle front end, (b) a nozzle contacting step of making contacts with the nozzle front end and the reference surface of the contact detection sensor to obtain a positional information of the nozzle, (c) a distance measurement step of measuring, by the non-contact distance sensor, a distance from the non-contact distance sensor to the work before applying the liquid to the work, and (d) a step of adjusting a nozzle clearance to a desired value based on the relative positional information between the nozzle and the non-contact distance sensor determined by the distance measurement step (a) and the nozzle contacting step (b), and the distance determined by the distance measurement step (c).

In the nozzle clearance adjusting method in the liquid application apparatus according to the present invention, it is preferable that the distance measurement step (a) comprises a distance adjusting step of adjusting a distance between the reference surface of the contact detection sensor and the non-contact distance sensor to a desired value.

Further, it is preferable to adjust the distance between the reference surface of the contact detection sensor and the non-contact distance sensor based on the measurement result of the distance from the non-contact distance sensor to the reference surface of the contact detection sensor by the non-contact distance sensor.

Furthermore, it is preferable to adjust the distance between the reference surface of the contact detection sensor and the non-contact distance sensor by continuously measuring the distance from the non-contact distance sensor to the reference surface of the contact detection sensor by the non-contact distance sensor until the distance becomes the desired value.

Further, it is preferable that the positional information of the nozzle obtained by the nozzle contacting step (b) is the coordinate value indicated by a moving unit, which relatively moves the nozzle and the reference surface of the contact detection sensor to each other.

Furthermore, it is preferable that the reference surface of the contact detection sensor is a movable surface moved by a contact pressure of the nozzle front end.

Further, it is preferable that the contact detection sensor is a sensor having a movable reference surface moved by a contact pressure of the nozzle front end and measuring a moving distance of the movable reference surface, and it is preferable that the nozzle contacting step (b) comprises a step of measuring the moving distance of the movable reference surface moved by the contact pressure of the nozzle front end, and the positional information obtained by the nozzle contacting step (b) comprises the moving distance of the movable reference surface moved by the contact pressure of the nozzle front end.

Further, it is preferable that the positional information of the nozzle is the coordinates value of the moving unit at the time the contact detection sensor no longer detects the contact pressure of the nozzle front end or at the time the displacement of the reference surface becomes zero, after the reference surface of the contact detection sensor is moved by the contact pressure of the nozzle front end and then the displacement by the pressure is decreased, Furthermore, it is preferable that the relative positional information includes a distance between the nozzle front end and the non-contact distance sensor.

Further, it is preferable that the moving unit includes a device for moving the nozzle vertically.

Furthermore, it is preferable that the moving unit includes a device for vertically moving a head section having the nozzle and the non-contact distance sensor.

Further, it is preferable that the distance measurement step (a) comprises a step of measuring a distance $L1$ to the reference surface of the contact detection sensor by the non-contact distance sensor, after positioning the contact detection sensor opposite to the reference surface of the non-contact distance sensor, and the nozzle contacting step (b) comprises a step of measuring a position coordinate $Zn$ of the moving unit when the nozzle front end is touched with the reference surface of the contact detection sensor by the operation of the moving unit, and the nozzle clearance is adjusted by the operation of the moving unit based on a relative positional relation between the nozzle and the non-contact distance sensor defined by the distance $L1$ from the non-contact distance sensor to the contact detection sensor and the position coordinate $Zn$ of the moving unit which are determined by the distance measurement step (a) and the nozzle contacting step (b).

Further, it is preferable that the distance measurement step (a) comprises a step of measuring a positional coordinate $Z1$ of the moving unit at the time of measuring the distance to the reference surface of the contact detection sensor, and the nozzle clearance is adjusted by the operation of the moving unit based on the relative positional relation between the nozzle and the non-contact distance sensor defined by the positional coordinates $Z1$ and $Zn$ of the moving unit.

Furthermore, it is preferable that the head section comprises at least one secondary moving unit to move vertically and separately the nozzle and/or the non-contact distance sensor, and it is preferable to comprise a second step of adjusting a vertical distance between the contact detection sensor and the nozzle by the secondary moving unit based on the relative positional relation between the contact detection sensor and the nozzle, after the first step including the distance measurement step (a) and the nozzle contacting step (b).

Further, it is preferable that a distance between a position on the reference surface of the contact detection sensor measured by the non-contact distance sensor in the distance measurement step (a) and a position of the nozzle front end to be contacted in the nozzle contacting step (b) is shorter than a distance between a position measured by the non-contact distance sensor and a position of the nozzle front end on a plane defined including the nozzle front end and parallel with the reference surface of the contact detection sensor.

Furthermore, it is preferable that the distance from the non-contact distance sensor is measured by irradiating a laser beam to the reference surface of the contact detection sensor and by receiving the return light from the reference surface in the distance measurement step (a).

Furthermore, it is preferable that the position of the contact detection sensor irradiated by the non-contact distance sensor in the distance measurement step (a) is the same as the position of the nozzle front end to be contacted in the nozzle contacting step (b).

Further, it is preferable that the nozzle contacting step (b) is conducted at each time of changing the nozzles.

Moreover, the present invention proposes a liquid application apparatus, wherein a nozzle from which the liquid is discharged and a work disposed facing to the nozzle and on which the liquid discharged from the nozzle is applied are moved relatively to each other in a first direction to adjust a clearance between the nozzle and the work to a desired value, comprising;

a non-contact distance sensor positioned in parallel with the nozzle and configured to measure a distance in the first direction in a noncontact manner, a contact detection sensor disposed facing to the nozzle and having a reference surface extending in a plane which is vertical to the first direction, a moving unit for moving relatively the nozzle and the work to each other in the first direction, wherein the reference surface of the contact detection sensor is defined as a detection surface of detecting a contact with the nozzle and a measurement surface measured by the non-contact distance sensor, and a controller configured to adjust the clearance between the nozzle and the work to a desired value, based on a relative position in the first direction of the nozzle and the non-contact distance sensor derived from a distance information concerning a distance from the non-contact distance sensor to the measurement surface of the reference surface obtained by measuring a distance to the reference surface by the non-contact distance sensor and a positional information concerning nozzle's contacting position obtained by having the nozzle contacted with the reference surface, and a distance to the work measured by the non-contact distance sensor before applying the liquid on the work.

Further, in the liquid application apparatus according to the present invention, it is preferable that the moving unit is one for moving the nozzle vertically.

Further, it is preferable that the moving unit is one for moving vertically the head section having the nozzle and the non-contact distance sensor mounted thereon.

Furthermore, it is preferable to provide at least one secondary moving unit for moving separately and vertically the nozzle and/or the non-contact distance sensor.

Further, it is preferable that a length between the outer edges of the reference surface of the contact detection sensor in a direction parallel with a line segment defined by connecting an irradiation position of the non-contact distance sensor on a plane defined including the nozzle front end and in parallel with the reference surface of the contact detection sensor and a position of the nozzle front end is shorter than a distance between the irradiation position of the non-contact distance sensor on the plane defined including the nozzle front end and in parallel with the reference surface of the contact detection sensor and the nozzle front end.

Further, it is preferable that the reference surface of the contact detection sensor is provided on a surface of movable portion of the contact detection sensor and adjusted to be possibly detected by the non-contact distance sensor.

Moreover, it is preferable that the contact detection sensor is configured to move in a direction of pressure applied by the nozzle while keeping the reference surface and the nozzle contacted with each other with the nozzle being pressed to the reference surface.

Further, it is preferable that the contact detection sensor is provided on a work holding device.

Further, it is preferable that the non-contact distance sensor is configured to measure a distance by irradiating a laser beam to the reference surface of the contact detection sensor and receiving a reflected light from the surface.

Moreover, according to the method of adjusting the nozzle clearance in the liquid application apparatus of the present invention, the nozzle contacting step of having the nozzle contacted the reference surface and the distance measuring step of measuring the distance from the non-contact distance sensor to the reference surface are carried out separately, when measuring the relative position between the nozzle and the non-contact distance sensor, instead of conventionally carrying out the distance measurement by the non-contact distance sensor at the same time of making the nozzle contacted with the measuring jig (the reference surface in the present invention). Therefore, a position of making the nozzle contacted and a position of measuring the distance by the non-contact distance sensor on the reference surface of the contact detection sensor are the same or made closer than conventional art, which enables decreasing the influence caused by windings, heaves of the measuring jigs or other, accurately obtaining information of the relative position between the nozzle and the non-contact distance sensor in the vertical direction and more accurately adjusting the nozzle clearance than conventional art.

BRIEF DESCRIPTION OF THE DRAWINGS

FIGS. 7 (a)-(c) are step charts showing other embodiment of a method of adjusting the nozzle clearance according to the present invention.

BEST MODE FOR CARRYING OUT THE INVENTION

The method of adjusting a nozzle clearance according to the present invention includes a distance measurement step of measuring a distance from a non-contact distance sensor to a reference surface of a contact detection sensor by the non-contact distance sensor, a nozzle contacting step of having the nozzle front end contacted the reference surface of the contact detection sensor, and a step of adjusting a nozzle clearance by operating a moving unit based on a corresponding relations among a distance from the non-contact distance sensor to the work, a condition of the moving unit, and a nozzle clearance, which is derived from the information obtained by the aforementioned steps.

Especially, in the present invention, a position of making the nozzle contacted and a position of measuring the distance to the non-contact distance sensor on the reference surface of the contact detection sensor are the same or made closer than conventional art, which enables decreasing the influence caused by windings, heaves of the measuring jigs or other, accurately obtaining information of the relative position between the nozzle and the non-contact distance sensor in the vertical direction and more accurately adjusting the nozzle clearance than conventional art.

Figure 1:
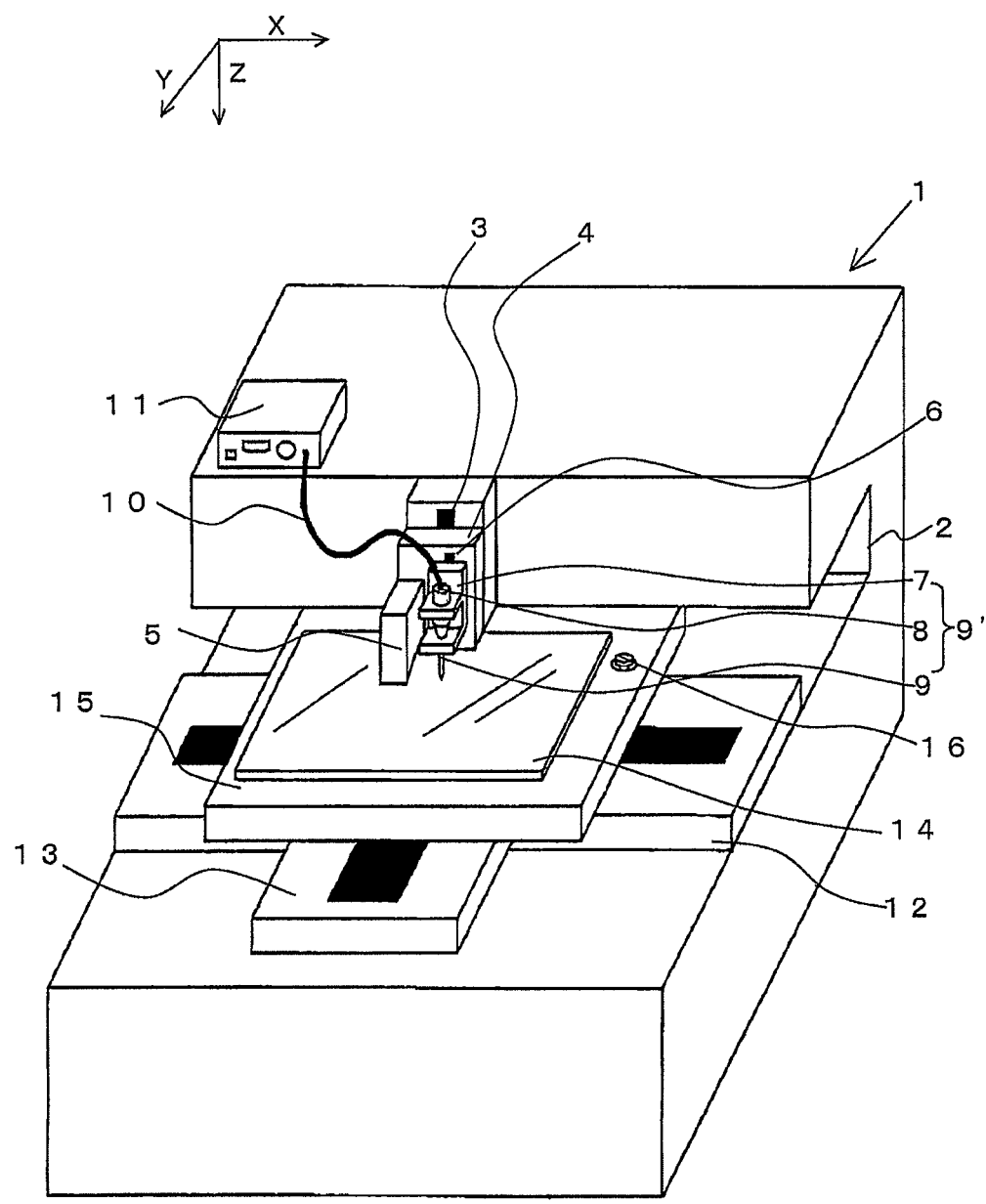
FIG. 1 is a perspective view showing one embodiment of a liquid application apparatus according to the present invention.

Further, the moving unit in the present invention is defined as a mechanism or device that has a function of changing the relative positional relation in the vertical direction among a nozzle holding mechanism, the non-contact distance sensor, a work holding mechanism, and the reference surface of the contact detection sensor, and a function of adjusting the nozzle clearance, and such a mechanism or device is not limited in terms of setting positions or numbers if it satisfies all of the aforementioned functions. For example, in one embodiment of a sealant application apparatus 1 according to the present invention as shown in FIG. 1, the moving unit includes a Z-axially moving table 3 which enables vertical moving of a head section 4, a sub Z-axially moving table 6 which enables vertical moving of a nozzle unit 9', and a touch sensor 16 having a reference surface 19a which is displaced vertically rearward when a nozzle 9 is put into touch therewith.

Hereinafter, the liquid application apparatus according to the present invention will be described with reference to FIG. 1. FIG. 1 shows one embodiment of the sealant application apparatus 1 including the Z-axially moving table 3 as a primary moving unit, and the sub Z-axially moving table 6 as a secondary moving unit mounted on a head section 4.

On the front top of a body 2 of the sealant application apparatus 1, there are provided the Z-axially moving table 3 and sub Z-axially moving table 6 as the moving unit, respectively. On the Z-axially moving table 3, a holder 7 as a nozzle holding member, reservoir 8, nozzle 9 and head section 4 having a laser displacement sensor 5 which is a non-contact distance sensor are provided movably in the Z-axial direction.

In this embodiment, the Z-axially moving table 3 and sub Z-axially moving table 6 are used as the moving unit, however, it should be noted that the moving units are not limited to such a table-shaped ones but they may be formed from a mechanism using belts or ball screws or a mechanism using racks and pinions.

Also, the sub Z-axially moving table 6 having the nozzle unit 9' including the holder 7, reservoir 8 and nozzle 9 is provided movably in the vertical direction (hereinafter referred to as "Z-axial direction"). The sub Z-axially moving table 6 is used to adjust the relative position between the nozzle 4 and laser displacement sensor 5 in the Z-axial direction correspondingly to a desired nozzle clearance before applying a sealant to the work 14 as will be described later.

Note that the sub Z-axially moving table 6 is not limited to the above-mentioned one that moves the nozzle unit 9' vertically in relation to the head section 4 but may be a moving unit provided on the laser displacement sensor 5 to move the laser displacement sensor 5 vertically for adjustment of the relative position between the nozzle 9 and laser displacement sensor 5 in the Z-axial direction. Also, the sub Z-axially moving table 6 may be a moving unit that moves both the nozzle unit 9' and laser displacement sensor 5 vertically independently of each other for the above adjustment.

The laser displacement sensor 5 is to measure a distance from the sensor 5 to an object by emitting laser light from its irradiation surface to the object at a predetermined angle and detecting, at its acceptance surface, the reflected light coming from the object. It should be noted that the non-contact distance sensor could be a sensor that can measure the distance without touching the object. That is, it may be a sensor using ultrasound, images or magnetic field. Also, a plurality of such non-contact distance sensors may be provided on the head section.

The holder 7 has the reservoir 8 for the sealant and the nozzle 9 installed thereon to communicate with the reservoir 8. The reservoir 8 communicates with a dispenser 11 via an air tube 10. The sealant in the reservoir 8 is pressurized by air supplied from the dispenser 11 for being discharged from the nozzle 9.

Note that the dispenser 11 is not limited to the above-mentioned one which supplies the air to the reservoir 8 for discharging the sealant, but may be any unit that can discharge the sealant from the nozzle 9. It may be, for example, a unit that can discharge the sealant out of the reservoir 8 by lowering a piston in the reservoir 8 by a mechanical driving unit or a unit including a large liquid reservoir and pump or the like installed at other than the head section 4 to supply the sealant under the action of the pump to the nozzle 9 on the head section 4 for discharging from the nozzle 9.

In the lower part of the sealant application apparatus body 2, an X-axially moving table 12 and Y-axially moving table 13 are provided perpendicularly to each other. The Y-axially moving table 13 is disposed above the X-axially moving table 12 and driven by the X-axially moving table 12 to move in the X-axial direction. Further, a work table 15 for holding the work 14 is disposed on the Y-axially moving table 13. The work table 15 is driven by the Y-axially moving table 13 to move in the Y-axial direction.

That is, the X- and Y-axially moving tables 12 and 13 are driven in combination to move the work table 15 in a desired direction in a plane defined by the X- and Y-axial directions.

The work table 15 for holding a work is planer as shown in FIG. 1. It should be noted however that the work table 15 is not limited to such a planer one but may be a table that holds a work by clamping from above and below, a table that holds a work at opposite ends of the latter from below or the like.

In the sealing application apparatus 1 shown in FIG. 1, the work table 15 is moved in the X- and Y-axial directions and the head section is moved in the Z-axial direction. However, it should be noted that the head section 4 may be moved in the X- and Y-axial directions while the work table 15 may be moved in the Z-axial direction or the head section 4 and work table 15 may horizontally be moved relatively to each other only in either the X- or Y-axial direction depending upon a shape to be drawn by the applied sealant.

The work 14 is to be applied with a sealant. It should be noted that in the production of a liquid crystal panel, a glass substrate is referred to as a "work". The work table 15 has a plurality of suction holes formed in the top surface thereof (hereinafter referred to as "work holding surface"). The work 14 is thus held, by suction, on the top of the work table 15.

Figure 5:
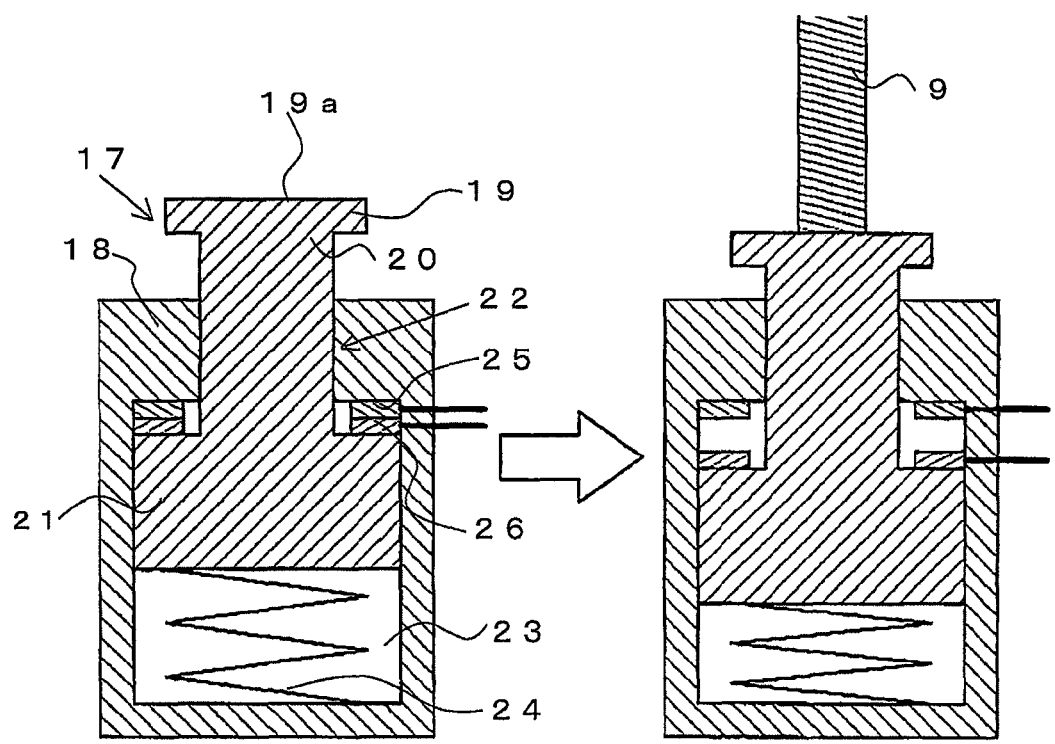
FIG. 5 is a cross-sectional view of a touch sensor shown as an example of the contact detection sensor used in the present invention.

On the top surface of the work table 15, there is provided the touch sensor 16 as a contact detection sensor beside the work holding surface, that is, on a part of the work table 15, which is not covered with the work 14 placed on the work table 15. The touch sensor 16 includes a housing 18a (of which the body is indicated with a reference numeral 18) and a movable part 17 fitted in the housing body 18 as shown in FIG. 5. When an object touches the top of the movable part 17, the latter as a whole will go down.

As shown, the movable part 17 includes a reference-surface plate 19 having on the top thereof a reference surface 19a of which the diameter is about 5 mm, a sliding shaft 20 connected at one end thereof to the bottom of the reference-surface plate 19, and a sliding block 21 to which the other end of the sliding shaft 20 is connected. The body 18 of the housing 18a is cylindrical. The housing 18a has a sliding hole 22 formed through the upper part thereof to communicate with an inside space 23 of the housing 18a. The sliding shaft 20 and sliding block 21 of the movable part 17 are fitted in the housing inside space 23 through the sliding hole 22.

Under the bottom of the sliding block 21, there is provided a spring 24 that normally forces the sliding block 21 upward to absorb a load applied when an object touches the reference surface 19a. Thus, when the nozzle touches the reference surface 19a, the latter will not possibly be strained and the nozzle end will not possibly be damaged.

The touch sensor 16 also includes electric terminals 25 and 26 at the top surfaces, respectively, of the housing inside space 23 and sliding block 21. When nothing touches the reference surface 19a of the reference-surface plate 19, the electric terminals 25 and 26 are electrically connected with each other. When any thing touches the reference surface 19a, the electric terminal 26 leaves the electric terminal 25, that is, the electrical connection between the electric terminals 25 and 26 is broken. Thus, the touch sensor 16 detects whether an object touches the reference surface 19a or not.

The above-mentioned touch sensor 16 may be a commercially available one. It may be of any other design so long as it can recognize that an object touches the reference surface 19a and has a movable part 17 that can absorb a long applied when the object touches the reference surface 19a.

In the sealant application apparatus shown in FIG. 1, since the laser displacement sensor 5 is used as the non-contact distance sensor, the reference surface 19a is mirror-finished to reflect laser light to the laser displacement sensor 5. For detection of displacement, however, the reference surface 19a may be finished depending upon the type of a non-contact distance sensor used.

The touch sensor 16 may be provided on a table having an XY-directionally moving unit, which is not the work table 15. In this case, any large XY-directionally moving unit such as the work table 15 may not be used but a smaller, higher-precision XY-directional moving unit may be used for more accurate adjustment of the nozzle clearance.

Further, the touch sensor 16 is not limited to the above one that outputs a signal the moment the nozzle 9 touches the reference surface 19a but may be a sensor that outputs a distance over which the movable part 17 has been moved. In this case, even if the moment when the nozzle 9 touches the reference surface 19a during distance measurement by the non-contact distance sensor, it is possible to determine a position (Z-axial coordinate) of the Z-axially moving table 3 when the nozzle 9 touches the reference surface 19a by subtracting a distance over which the movable part 17 has been moved due to the touch with the reference surface 19a from the position of the Z-axially moving table 3 when the nozzle 9 touches the reference surface 19a.

Figure 2:
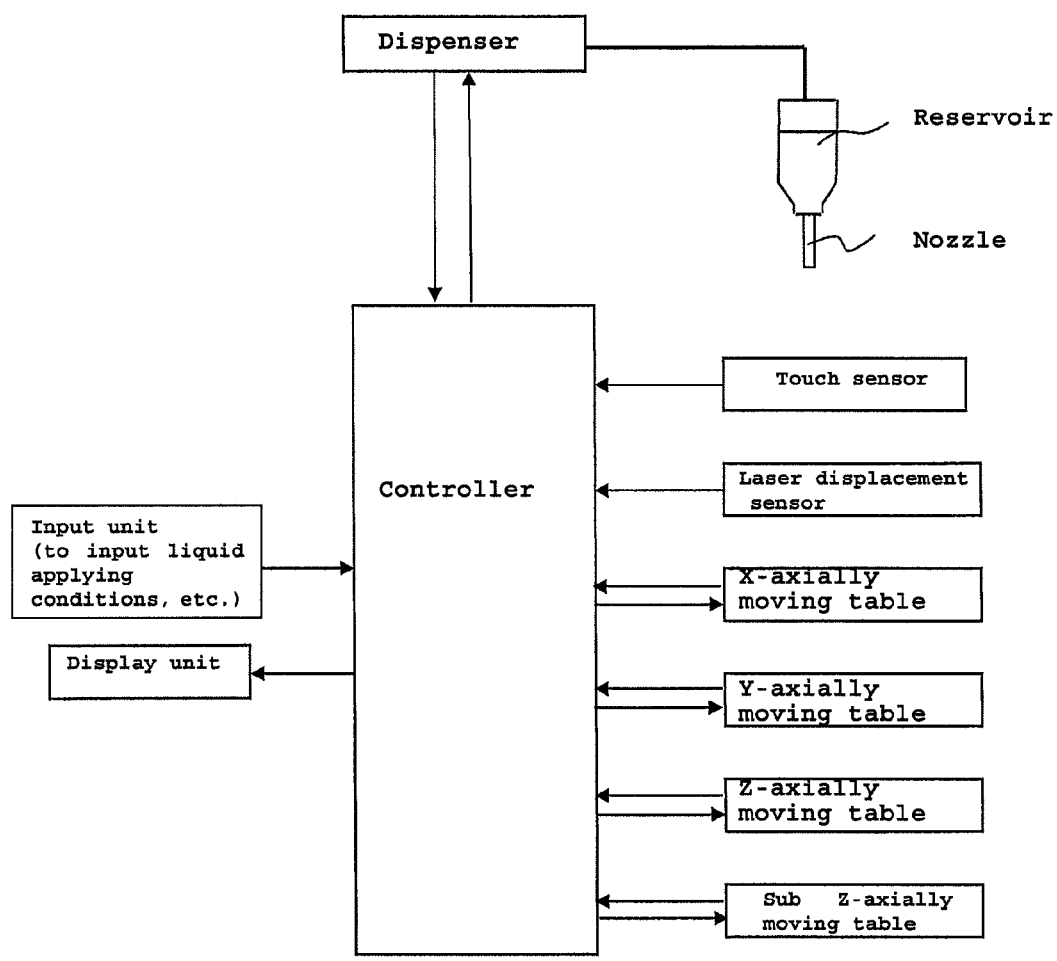
FIG. 2 schematically illustrates a control system of the liquid application apparatus according to the present invention.

FIG. 2 shows a control system of the sealant application apparatus shown in FIG. 1. The control system includes a controller having an input unit and display unit. The apparatus operator can operate the input unit to make entry of liquid applying conditions and visually recognize, on the display unit, the information entered and information collected from various units connected to the controller.

The controller sends a drive signal to each of the X-, Y- and Z-axially moving tables, sub Z-axially moving table and work table, and liquid application-relevant information to the dispenser 11. The controller controls the volume of air supplied from the dispenser 11 to the reservoir 8 through the air tube 10. On the other hand, the controller is supplied with information such as position signals from the tables, measured value from the laser displacement sensor 5, touch or no touch of an object with the touch sensor 16 (conduction or no conduction between the electric terminals 25 and 26), etc.

Such a controller is for example, structured in the form of electric circuit formed on the circuit substrate of the printed wiring board and accommodated at the lower part of the liquid application apparatus chassis in FIG. 1. The programs supplied in the controller, are for example, generally transmitted through specialized inputting devices or personal computers. In that case, a personal computer could be used as the controller in the apparatus of the liquid application apparatus. In such case, a personal computer is used only for making programs and the control in the liquid application apparatus is made by the above described electric circuit, however, the control is possibly made by the electric circuit mounted in the personal computer.

The personal computer could be set separately from the apparatus of the liquid application apparatus as described above, or could be accommodated in the liquid application apparatus body.

Next, there will be described how the nozzle clearance is adjusted in the sealant application apparatus according to the present invention. It should be noted that in the embodiment explained below, the coordinate (position and value) of the Z-axially moving table 3 depends upon the position of the head section 4 in relation to the Z-axially moving table 3 and the coordinate of the sub Z-axially moving table 6 depends upon the position of the holder 7 in relation to the sub Z-axially moving table 6.

EMBODIMENT 1

This embodiment is the liquid application apparatus (shown in FIG. 1) using the Z-axially moving table 3, sub Z-axially moving table 6 and touch sensor 16 as the vertical position changer. The nozzle clearance is adjusted as will be explained below with reference to the flow diagram shown in FIG. 3 and FIGS. 4 (a)-4(d).

(1) Step 1 (Power-up):
(2) Step 2 (Setting of liquid applying conditions):

The apparatus operator makes entry of liquid applying conditions such as a position where the application is to be started, pressure of air supplied from the application apparatus 11, nozzle clearance, etc.

Figure 4A:
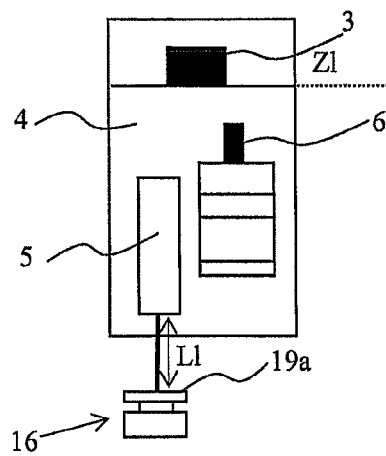
FIGS. 4 (a)-(c) are step charts showing an embodiment of a method of adjusting the nozzle clearance according to the present invention.

(3) Step 3 (Distance measurement step):

As shown in FIG. 4(a), the X- and Y-axially moving tables 12 and 13 are driven for the laser displacement sensor 5 to come to just above the touch sensor 16, laser light is emitted from the laser displacement sensor 5 to the reference surface 19a of the touch sensor 16, and return light from the touch sensor 16 is detected by the laser displacement sensor 5 to measure the distance (L1) from the laser displacement sensor 5 to the reference surface 19a of the touch sensor 16 and also the position coordinate (Z1) of the Z-axially moving table 3 when the laser displacement sensor 5 has come to just above the touch sensor 16.

(4) Step 4 (Installation of the nozzle):

The nozzle 9 is installed to the holder 7 of the sub Z-axially moving table 6. It should be noted that since the nozzle 9 is disposed below the reservoir 8 to communicate with the latter, it should be installed together with the reservoir 8 to the holder 7. (Generally, the front end of the nozzle 9 is not in a constant position in relation to the laser displacement sensor 5 because of a variation in size of the nozzle 9 and reservoir 8 from one to the other, inaccuracy of the installation by the apparatus operator, etc.)

Figure 4B:
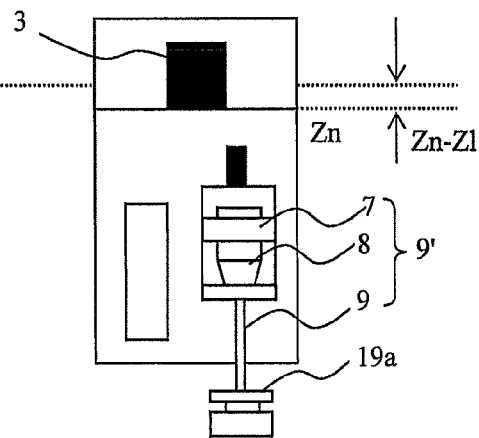

(5) Step 5 (Nozzle contacting step):

As shown in FIG. 4(b), the X- and Y-axially moving tables 12 and 13 are driven for the nozzle 9 to come to just above the touch sensor 16, and then the Z-axially moving table 3 is driven to put the nozzle 9 into touch at the front end thereof with the reference surface 19a of the touch sensor 16 to measure the position coordinate (Zn) of the Z-axially moving table 3 at the instant of the touch sensor 16 no longer detecting pressures applied by the contact of the front end of nozzle 9 or displacement of the reference surface 19a becoming zero. This positional coordinate (Zn) of the Z-axially moving table 3 becomes the information of the nozzle's position.

In this embodiment, the distance between the position on the reference surface 19a of the touch sensor 16 where the laser light is incident as in step (3) and position where the front end of the nozzle 9 touches the reference surface 19a as in step (5) are desirably shorter than the distance between the position in a plane parallel to the reference surface 19a of the touch sensor 16, which plane is defined including the front end of the nozzle 9, where the laser light emitted from the laser displacement sensor 5 is incident and the position of the front end of the nozzle 9. That is, the distance between the outer edges of the touch-sensor reference surface 19a in a direction parallel to a line connecting the position in the plane parallel to the reference surface 19a of the touch sensor 16, which plane is defined including the front end of the nozzle 9, where the laser light from the laser displacement sensor 5 is incident, and position of the front end of the nozzle 9 are desirably shorter than the distance between the position in the plane where the laser light from the laser displacement sensor 5 is incident and position of the front end of the nozzle 9 or the position where the laser light is incident desirably coincides with the position where the nozzle 9 touches the reference surface 19a.

In the convention nozzle clearance adjusting method, since the steps of distance measurement and nozzle movement for touch with the reference surface are effected simultaneously, the distance between the position on the reference surface 19a of the touch sensor 16 where the laser light is incident and position where the nozzle 9 is put into touch at the front end thereof with the reference surface 19a is a distance between the position, where the laser light from the laser displacement sensor 5 is incident, in a plane parallel to the reference surface 19a of the touch sensor 16 and which is defined including the front end of the nozzle 9 and the position of the front end of the nozzle 9 and thus it cannot be shorter. In this sealant application apparatus 1 according to this embodiment, however, since the steps of distance measurement and nozzle movement for touch with the reference surface are effected separately, the position where the distance measurement by the laser displacement sensor 5 is done and position where touch of the front end of the nozzle 9 with the reference surface 19a of the touch sensor 16 is detected can be nearer to each other than in the related art or be coincident with each other. Thus, it is possible to minimize the Z-axial displacement due to the distortion, inclination or the like of the touch sensor, accurately measure the Z-axial relative position between the nozzle and non-contact distance sensor and adjust the nozzle clearance always to a constant value.

(6) Step 6 (Adjustment of the relative position between the nozzle and laser displacement sensor in the Z-axial direction):

Based on the values (L1, Zn, Z1) measured in steps 3 and 5, the Z-directional relative position between the nozzle 9 and laser displacement sensor 5 (distance Zn-Z1 from the front end of the nozzle 9 to the touch-sensor reference surface 19a when the distance from the laser displacement sensor 5 to the touch-sensor reference surface 19a is L1) is determined. A drive signal concerning the relative position is sent from the controller to the sub Z-axially moving table 6 to move the sub Z-axially moving table 6 vertically, thereby adjusting the nozzle clearance to a desired value.

Figure 4C:
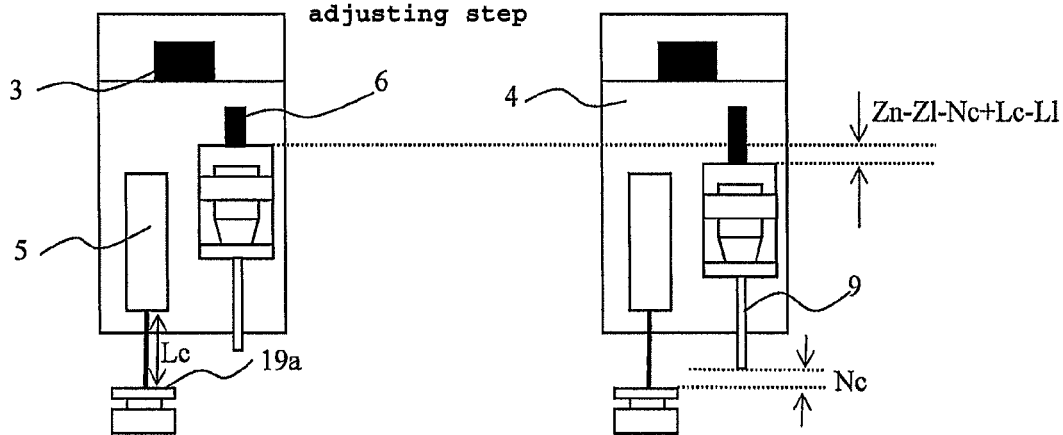

That is, in case it is desired in this embodiment for the laser displacement sensor 5 to provide an output Lc when the desired nozzle clearance is Nc as shown in FIG. 4(c), the distance from the front end of the nozzle 9 to the touch-sensor reference surface 19a is (Zn+Z1)+(Lc−L1) when the Z-axially moving table 3 is driven to move the head section 4 vertically for the output from the laser displacement sensor 5 to be Lc. Thus, for the desired nozzle clearance Nc, the sub Z-axially moving table 6 should be moved down over a distance of Zn−Z1+Lc−L1−Nc.

Note that in this embodiment, the output values L1 and Lc of the laser displacement sensor 5, coordinate values Z1 and Zn of the Z-axially moving table 3 and nozzle clearance Nc are all in the same unit and defined so that the coordinate value of the Z-axially moving table 3 will increase as the head section 4 and the touch-sensor reference surface 19a move toward each other while the outputs of the laser displacement sensor 5 and nozzle clearance Nc increase as the nozzle 9 moves away from the touch-sensor reference surface 19a.

In this embodiment, the head section 4 has provided thereon the sub Z-axially moving table 6 capable of moving only the nozzle unit 9' in addition to the Z-axially moving table 3 as having been described above. When the nozzle is replaced, the relative position between the nozzle and non-contact distance sensor can be adjusted by driving only the sub Z-axially moving table 6. Thus, in the sealant application apparatus having the sub Z-axially moving table 6 as in this embodiment, the relative position between the nozzle and non-contact distance sensor can be adjusted for the non-contact distance sensor to measure the distance with a highest accuracy.

(7) Step 7 (Liquid application from the nozzle to the work):

First, a work 14 is mounted on the work table 15 and held by suction. Thereafter, the sealant applying conditions entered in step 1 are sent from the controller to the X- and Y-axially moving tables 12 and 13. According to the sealant applying conditions, the X- and Y-axially moving tables 12 and 13 are driven to move the work table 15 so that the liquid application to the work 14 can be started beneath the nozzle 9.

Further, a drive signal is sent from the controller to the Z-axially moving table 3. The Z-axially moving table 3 is thus driven to move the head section 4 vertically for the distance from the work 14 to the laser displacement sensor 5 to be Lc (output of the laser displacement sensor 5 when the desired nozzle clearance is Nc). Since the Z-directional relative position between the nozzle 9 and laser displacement sensor 5 has already been adjusted in step 6, the nozzle clearance is always to the desired value Nc even in case the work 14 is distorted or inclined.

Then, the X- and Y-axially moving tables 12 and 13 are moved for the nozzle 9 to move along a route of sealant application having been set in step 1, to thereby move the work table 15 in the XY plane. At the same time, a signal is sent from the controller to the application apparatus 11 to supply air under a pressure having been set in step 1 from the application apparatus 11 to the reservoir 8 via air tube 10 to discharge a sealant from the nozzle 9 provided on the reservoir 8.

(8) Step 8 (End of Application):

When the nozzle 9 arrives at the end point of application on the work 14, the X- and Y-axially moving tables 12 and 13 are stopped from being driven and the air supply from the application apparatus 11 is stopped at the same time. Further, the Z-axially moving table 3 is driven to move the head section 4 upward, thereby ending the sealant application.

Thereafter, the sealant application is made on a next work 14 or discontinued. When it is decided that the application is not to be stopped, it is determined in step 9 whether the nozzle has to be replaced or not. In case no sufficient amount of the sealant remains in the reservoir 8 or the nozzle 9 is found clogged, the nozzle 9 has to be replaced. Otherwise, it may be judged based the sealant applying conditions having been set in step 1, such as a time of application, number of works, etc. whether the nozzle has to be replaced or not. In case it is decided that the nozzle may not be replaced, the controller returns to step 7 and starts the procedure of sealant application. On the other hand, in case it is decided that the nozzle has to be replaced, the controller returns to step S4 and adjusts the Z-axial relative position between the nozzle 9 and laser displacement sensor 5.

Note that in step 3, with the value to be measured L1 by the laser displacement sensor 5 being preset to a desired one, the distance measuring from the laser displacement sensor 5 to the reference surface 19a of the touch sensor 16 could be repeated until the value measured by the laser displacement sensor 5 becomes L1 based on which the Z-axially moving table 3 could be operated to memorize the position coordinate Z1 of the Z-axially moving table 3. In this method, because the value L1 measured by the laser displacement sensor 5 is already known, it may not be stored at each measurement. Further, setting of the value L1 to zero will simplify the calculation for easier understanding.

Also, in step 6, the sub Z-axially moving table 6 may be driven so that the value Lc measured by the laser displacement sensor 5 when the desired nozzle clearance is Nc becomes zero, to thereby adjust the Z-axial position between the nozzle 9 and laser displacement sensor 5.

Especially, since the laser displacement sensor 5 can generally measure the distance with the highest accuracy when the value measured by the laser displacement sensor 5 is zero, so the displacement between the nozzle 9 and laser displacement sensor 5 can be corrected accurately.

In case it is decided in step 9 that the nozzle has to be replaced, the controller may return to step 3 and effect the distance measurement by the laser displacement sensor 5 again. Thus, the position of the laser displacement sensor 5 can be confirmed at each replacement of the nozzle. However, since the laser displacement sensor 5 is always left installed, it is unlikely that the position of the laser displacement sensor 5 varies. So, the distance measurement in step 3 should preferably not be effected at each replacement of the nozzle for quick adjustment of the Z-directional position between the nozzle and laser displacement sensor.

In this embodiment according to the present invention, the steps of distance measurement and nozzle movement into touch with the touch-sensor reference surface 19a are effected separately, and the nozzle clearance is adjusted on the basis of information obtained in the above steps. So, the nozzle may be moved into touch with the reference surface 19a before the distance is measured, regardless of the orders of the respective steps. In this case, step 3 is effected after step 5.

EMBODIMENT 2

Figure 3:
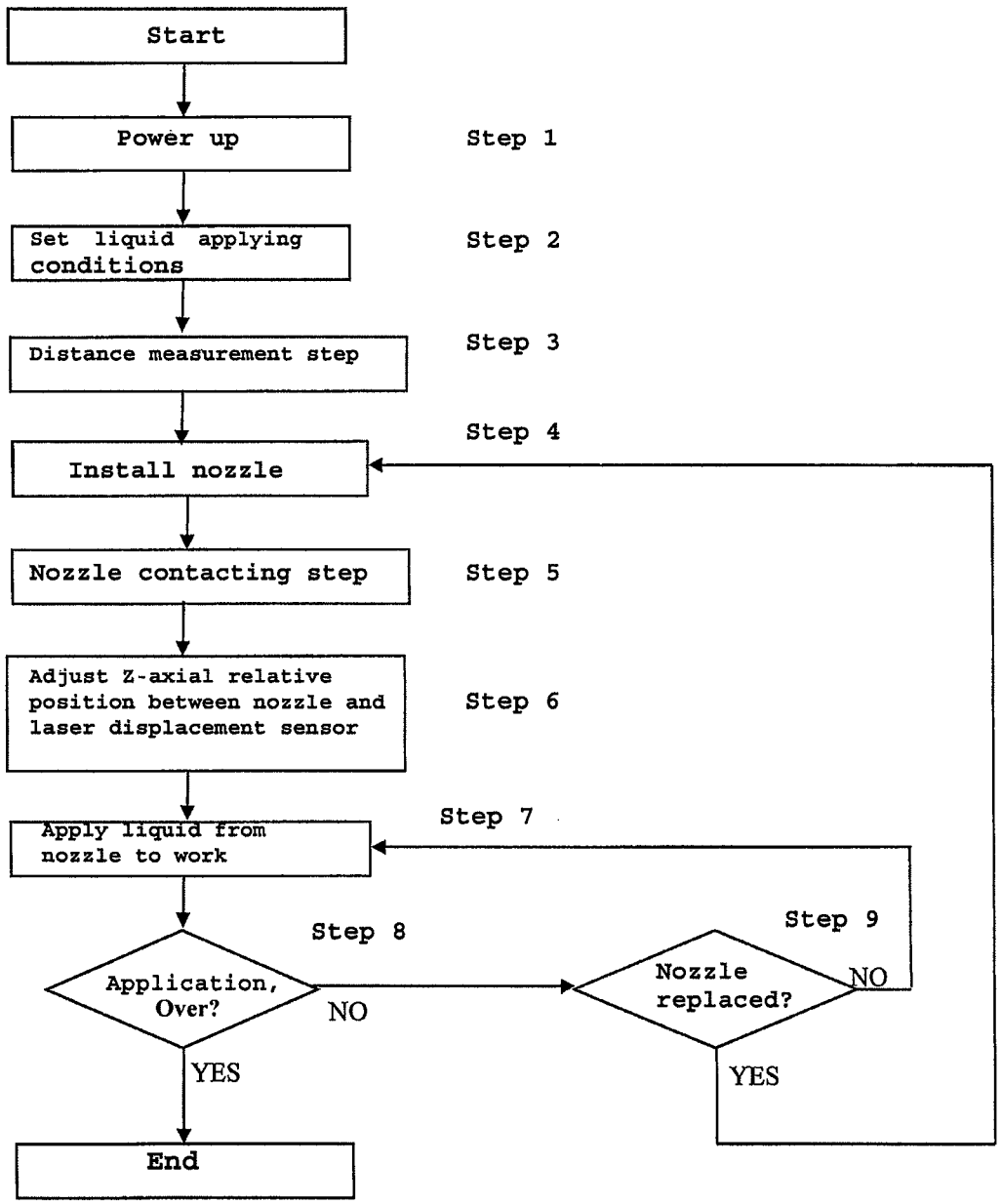
FIG. 3 is a flow diagram of the operation of the liquid application apparatus according to the present invention.
Figure 6:
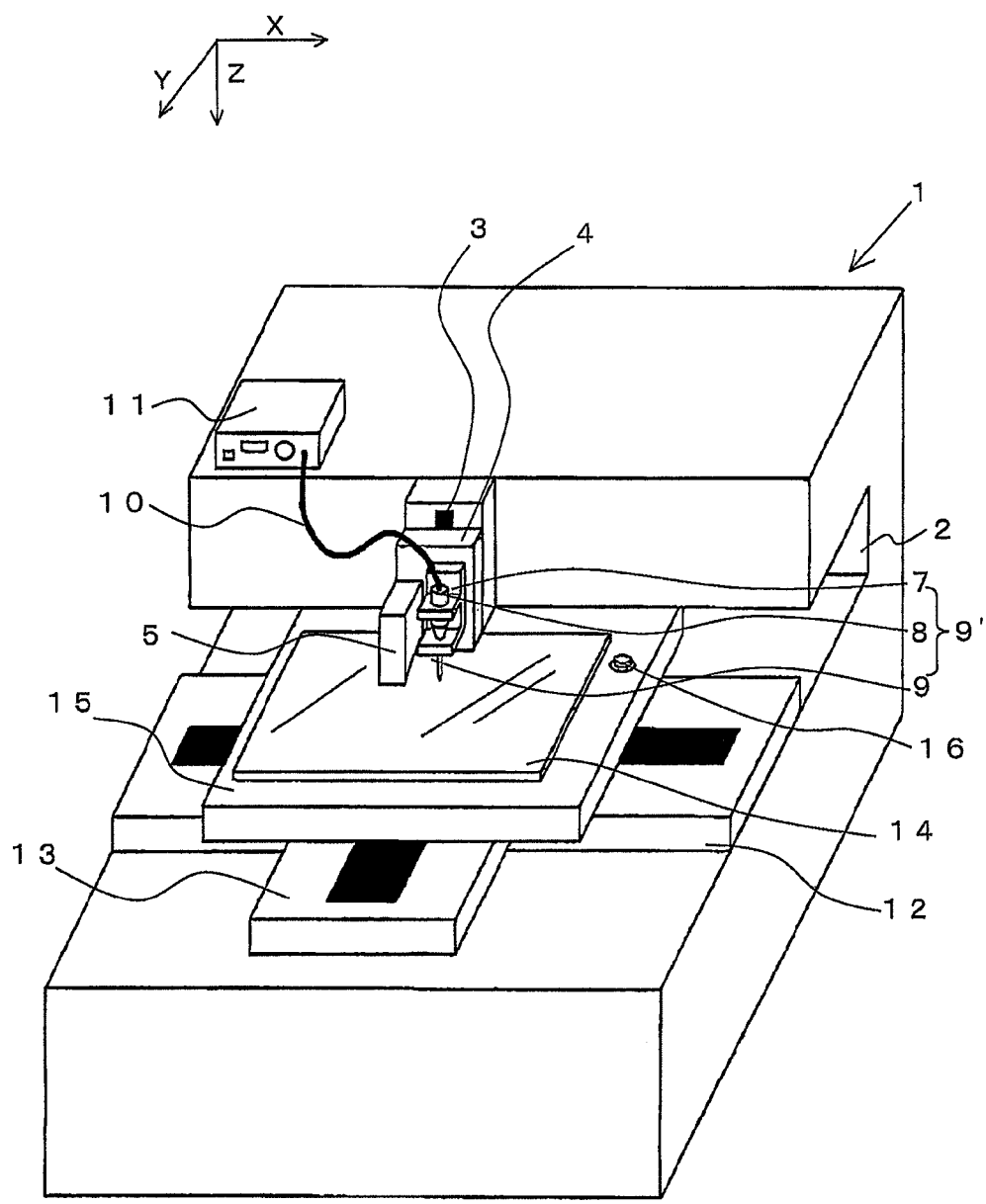
FIG. 6 is a perspective view of other embodiment of a liquid application apparatus according to the present invention.

There will be explained with reference to the flow diagram in FIG. 3 and the step chars in FIGS. 7 (a)-7(c) how to adjust the nozzle clearance in a sealant application apparatus (see FIG. 6) in which the Z-axially moving table 3 and touch sensor 6 are used as the vertical position changers according to another embodiment of the present invention. It should be noted that operations up to step 5 in FIG. 3 are effected as having been described above.

In step 6, the Z-axial relative position between the nozzle 9 and laser displacement sensor 5 is adjusted. In this adjustment, a Z-axial relative position between the nozzle and laser displacement sensor (distance Zn-Z1 from the front end of the nozzle 9 to the touch-sensor reference surface 19a when the distance from the laser displacement sensor 5 to the touch-sensor reference surface 19a is L1) is obtained based on the values (L1, Z1, Zn) measured in steps 3 and 5 as shown in FIGS. 7(a) and 7(b). So, a value Lc is measured based on the relative position by the laser displacement sensor when the desired nozzle clearance to the work 14 is Nc. (see FIG. 7 (c).)

That is, when the desired nozzle clearance is Nc, the value Lc measured by the laser displacement sensor is Lc=Zn+Z1+Nc+L1. In step 7, the Z-axially moving table 3 is driven for the laser displacement sensor to measure the value Lc, to thereby move the head section 4 and adjust the nozzle clearance to the value Nc. Step 7 and subsequent steps are effected as shown in FIG. 3.

EMBODIMENT 3

Here will be explained how to adjust the nozzle clearance in the sealant application apparatus shown in FIG. 1 by a method different from that in the embodiment 1. This embodiment 3 and embodiment 1 are different from each other as follows. In the embodiment 1, in step 5 where the nozzle 9 is moved into touch with the reference surface 19a, the Z-axially moving table 3 is driven to put the nozzle 9 into touch at the front end thereof with the reference surface 19a of the touch sensor 16. In this embodiment 3, however, the sub Z-axially moving table 6 is driven to put the nozzle 9 into touch at the front end with the reference surface 19a of the touch sensor 16. Further, in the embodiment 1, the Z-axially moving table 3 is driven to move the nozzle 9 vertically in step 7. In this embodiment 3, however, the sub Z-axially moving table 6 is driven to move the nozzle 9 vertically.

The nozzle clearance adjustment by this method will be explained below with reference to the flow diagram in FIG. 3 and the step charts in FIGS. 8 (a)-8(d). It should be noted that the description having previously been made of the embodiment 1 covers all things not particularly described herebelow.

Figure 8A:
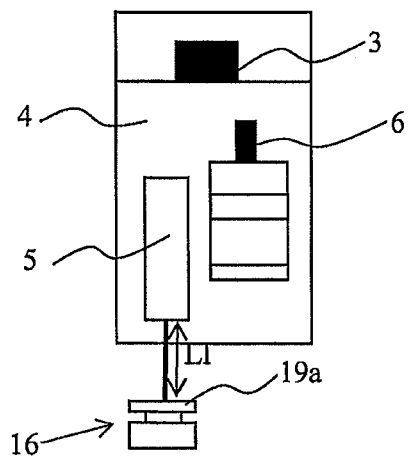
FIGS. 8 (a)-(d) are step charts showing still other embodiment of a method of adjusting the nozzle clearance adjustment according to the present invention.

(1) Step 1 (Power-up):
(2) Step 2 (Setting of liquid applying conditions):
(3) Step 3 (Distance measurement step):

As shown in FIG. 8(a), the X- and Y-axially moving tables 12 and 13 are driven for the laser displacement sensor 5 to come to just above the touch sensor 16, laser light is emitted from the laser displacement sensor 5 to the reference surface 19a of the touch sensor 16, and return light from the touch sensor 16 is detected by the laser displacement sensor 5 to measure the distance (L1) from the laser displacement sensor 5 to the reference surface 19a of the touch sensor 16.

Figure 8B:
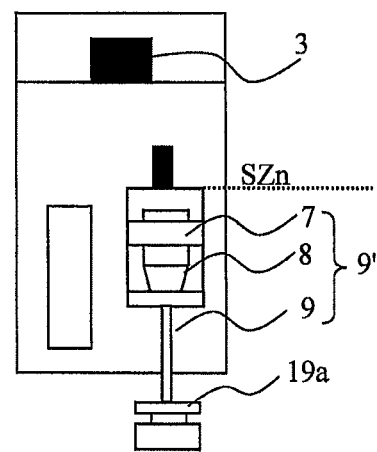

(4) Step 4 (Installation of the nozzle):
(5) Step 5 (Nozzle contacting step):

As shown in FIG. 8(b), the X- and Y-axially moving tables 12 and 13 are driven for the nozzle 9 to come to just above the touch sensor 16, and then the sub Z-axially moving table 6 is driven to put the nozzle 9 into touch at the front end thereof with the reference surface 19a of the touch sensor 16 to measure the position coordinate (SZn) of the sub Z-axially moving table 6 at the time the nozzle 9 touches the touch sensor 16.

(6) Step 6 (Adjustment of the relative position between the nozzle and laser displacement sensor in Z-axial direction):

Based on the values (L1, SZn) measured in steps 3 and 5, the Z-directional relative position between the nozzle 9 and laser displacement sensor 5 is determined.

That is, when the distance from the laser displacement sensor 5 to the touch-sensor reference surface 19a is L1 and the sub Z-axially moving table 6 is in a position indicative of the coordinate SZn, the front end of the nozzle 9 will be in touch with the touch-sensor reference surface 19a. Therefore, for a desired nozzle clearance Nc when the laser displacement sensor 5 outputs an output Lc, the sub Z-axially moving table 6 should be driven for the coordinate to be SZn−(L1−Lc)−Nc.

Note that in this embodiment 3, the output values L1 and Lc of the laser displacement sensor 5, coordinate SZn of the sub Z-axially moving table 6 and nozzle clearance Nc are all in the same unit and defined so that the coordinate value of the sub Z-axially moving table 6 will increase as the head section 4 and work 14 move toward each other while the output values from the laser displacement sensor 5 and nozzle clearance Nc increase as the nozzle 9 moves away from the work 14.

(7) Step 7 (Liquid application from the nozzle to the work):

First, a work 14 is mounted on the work table 15 and held by suction. The sub Z-axially moving table 6 is moved upward. Thereafter, the sealant applying conditions entered in step 1 are sent from the controller to the X- and Y-axially moving tables 12 and 13. According to the sealant applying conditions, the X- and Y-axially moving tables 12 and 13 are driven to move the work table 15 so that the liquid application to the work 14 can be started beneath the nozzle 9.

Figure 8C:
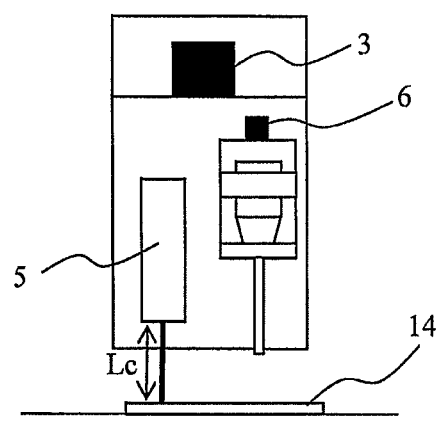

Further, a drive signal is sent from the controller to the Z-axially moving table 3. The Z-axially moving table 3 is thus driven to move the head section 4 vertically for the distance from the work 14 to the laser displacement sensor 5 to be Lc (output of the laser displacement sensor 5 when the desired nozzle clearance is Nc) as shown in FIG. 8(c). The value Lc should be a one for the highest accuracy of measurement by the laser displacement sensor 5. Also, since the sub Z-axially moving table 6 has already been moved up, the nozzle 9 will not possibly collide with the work 13.

Figure 8D:
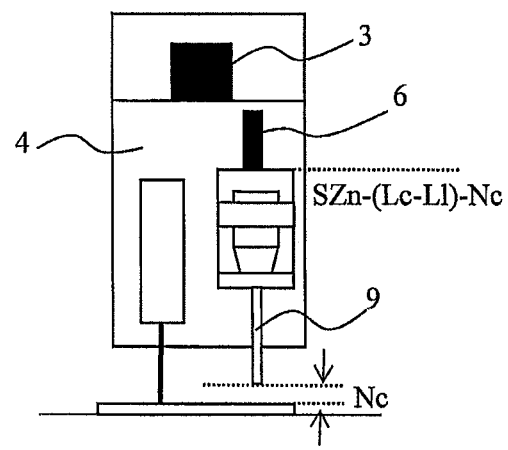

Thereafter, the sub Z-axially moving table 6 is moved for the coordinate of the sub Z-axially moving table 6 to be (SZn−(L1−Lc)−Nc) as shown in FIG. 8(d).

In this embodiment, since the horizontal positions of the nozzle 9 and work 14 are changed by driving the X- and Y-axially moving tables 12 and 13 without driving the Z-axially moving table 3, so the work 4 is not moved vertically (in the Z-axial direction). The output value Lc from the laser displacement sensor 5 will be changed correspondingly to an undulation or inclination of the surface of the work 14. However, even if the output Lc has varied, the nozzle clearance Nc can be adjusted to a desired value by moving the sub Z-axially moving table 6 correspondingly to the varied output Lc for the coordinate to be (SZn−(L1−Lc)−Nc).

Also, the nozzle clearance Nc may be adjusted only at start of the sealant application to each work and the sub Z-axially moving table 6 may normally be left fixed during the sealant application, as necessary.

(8) Step 8 (End of application):

EMBODIMENT 4

Figure 9:
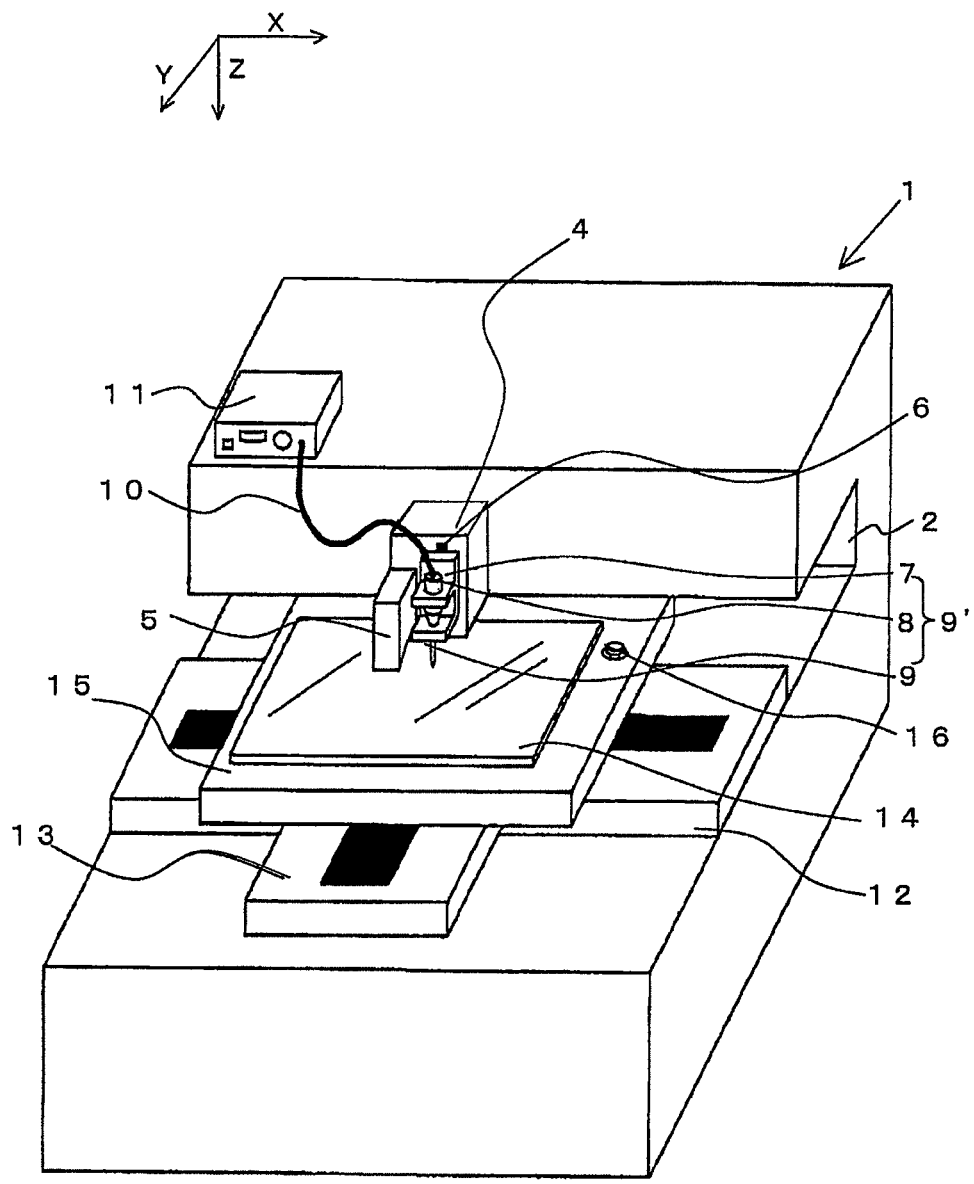
FIG. 9 is a perspective view of still other embodiment of a liquid application apparatus according to the present invention.

As another embodiment of the present invention, a method of adjusting the nozzle clearance by using the liquid application apparatus with reference to FIG. 9, having the sub Z-axially moving table 6 provided on the head section 4 as a moving unit will be explained below with reference to the flow diagram in FIG. 3 and the step charts in FIGS. 10 (a)-10(d). It should be noted that the description having previously been made of the embodiment 1 covers all things not particularly described herebelow.

Figure 10A:
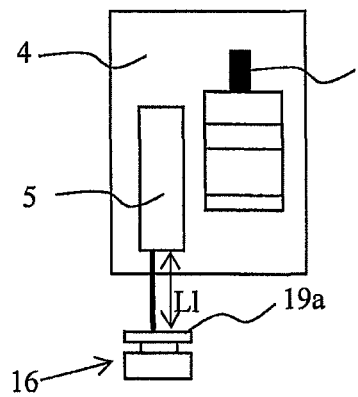
FIGS. 10 (a)-(d) are step charts showing still other embodiment of a method of adjusting the nozzle clearance according to the present invention.

(1) Step 1 (Power-up):

(2) Step 2 (Setting of liquid applying conditions):

(3) Step 3 (Distance measurement step):

As shown in FIG. 10(a), the X- and Y-axially moving tables 12 and 13 are driven for the laser displacement sensor 5 to come to just above the touch sensor 16, laser light is emitted from the laser displacement sensor 5 to the reference surface of the touch sensor 16, and return light from the touch sensor 16 is detected by the laser displacement sensor 5 to measure the distance (L1) from the laser displacement sensor 5 to the reference surface of the touch sensor 16.

Figure 10B:
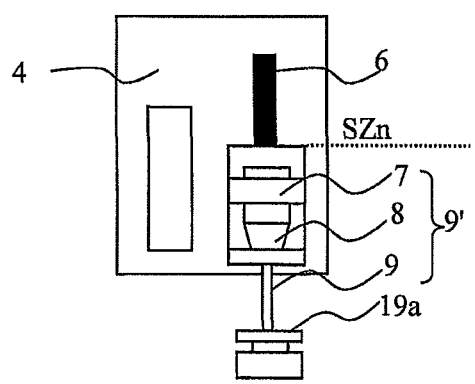

(4) Step 4 (Installation of the nozzle):

(5) Step 5 (Nozzle contacting step):

As shown in FIG. 10(b), the X- and Y-axially moving tables 12 and 13 are driven for the nozzle 9 to come to just above the touch sensor 16, and then the sub Z-axially moving table 6 is driven to put the nozzle 9 into touch at the front end thereof with the reference surface 19a of the touch sensor 16 to measure the position coordinate (SZn) of the sub Z-axially moving table 6 at the time the nozzle 9 touches the touch sensor 16.

(6) Step 6 (Adjustment of the relative position between the nozzle and laser displacement sensor in Z-axial direction):

Based on the values (L1, SZn) measured in steps 3 and 5, the Z-directional relative position between the nozzle 9 and laser displacement sensor 5 is determined.

Figure 10C:
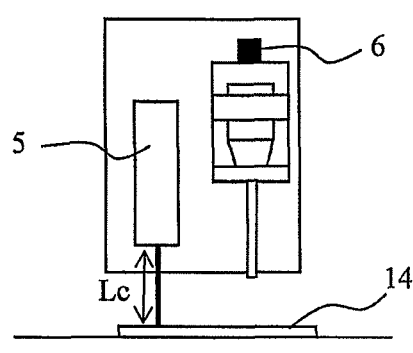

That is, when the distance from the laser displacement sensor 5 to the touch-sensor reference surface 19a is L1 and the sub Z-axially moving table 6 is in a position indicative of the coordinate SZn, the nozzle 9 will be in touch at the front end thereof with the touch-sensor reference surface 19a. Therefore, for a desired nozzle clearance Nc when the laser displacement sensor 5 outputs an output Lc, the sub Z-axially moving table 6 should be driven for its coordinate to be SZn−(L1−Lc)−Nc as shown in FIGS. 10(c) and 10(d).

(7) Step 7 (Liquid application from the nozzle to the work):

First, a work 14 is mounted on the work table 15 and held by suction. The sub Z-axially moving table 6 is moved upward. Thereafter, the sealant applying conditions entered in step 1 are sent from the controller to the X- and Y-axially moving tables 12 and 13. According to the sealant applying conditions, the X- and Y-axially moving tables 12 and 13 are driven to move the work table 15 so that the liquid application to the work 14 can be started beneath the nozzle 9.

Figure 10D:
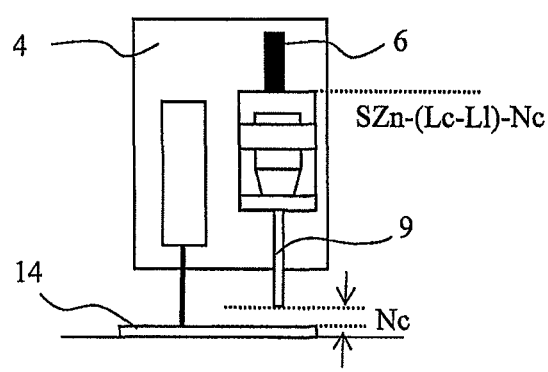
Figure 11:
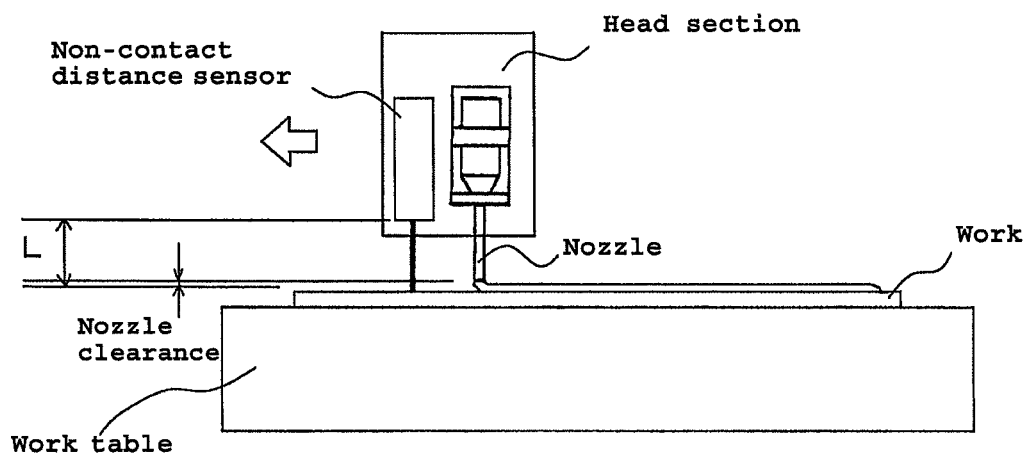
FIG. 11 is a schematic view of the conventional liquid application apparatus.

With the output of the laser displacement sensor 5 being taken as Lc at this time and the sub Z-axially moving table 6 being driven for its coordinate to be (SZn−(L1−Lc)−Nc) as shown in FIG. 10(d), the nozzle clearance Nc can be made a desired distance.

In this embodiment, the X- and Y-axially moving tables 12 and 13 are moved during application to change the horizontal positions of the nozzle 9 and work 14.

The output Lc of the laser displacement sensor 5 varies depending upon undulation or inclination of the surface of the work 14. Even if the output Lc varies, the nozzle clearance Nc can be kept at a desired value by moving the sub Z-axially moving table 6 correspondingly to the variation of the output Lc for its coordinate to be (SZn−(L1−Lc)−Nc).

Also, the nozzle clearance Nc may be adjusted only at start of the sealant application to each work and the sub Z-axially moving table 6 may normally be left fixed during the sealant application, as necessary.

(8) Step 8 (End of application):

EMBODIMENT 5

Next, there will be explained how to adjust the nozzle clearance in case the movable part 17 of the touch sensor 16 is supplied with a signal of a distance over which the reference surface 19a of the touch sensor 16 has been moved.

For example, in the liquid application apparatus according to the embodiment 1, in case the reference surface 19a of the touch sensor 16 has been moved down over a distance of d when the coordinate of the Z-axially moving table 3 is Zn in step 5, the distance from the front end of the nozzle 9 to the touch-sensor reference surface 19a is Zn−d−Z1 under the assumption that the distance from the laser displacement sensor 5 to the touch-sensor reference surface 19a is L1.

Therefore, in case it is arranged that the output of the laser displacement sensor 5 is Lc, the distance from the front end of the nozzle 9 to the touch-sensor reference surface 19a will be (Zn−d−Z1)+(Lc−L1), and the distance over which the sub Z-axially moving table 6 is to be moved down for the desired nozzle clearance to be Nc will be Zn−Z1+Lc−L1−Nc−d.

Similarly, in the liquid application apparatus according to the embodiment 2, in case the reference surface 19a of the touch sensor 16 has been moved down over a distance d when the coordinate of the Z-axially moving table is Zn, the distance from the front end of the nozzle 9 to the touch-sensor reference surface 19a is Zn−d−Z1 under the assumption that the distance from the laser displacement sensor 5 to the touch-sensor reference surface 19a is L1. So, when the desired nozzle clearance is Nc, the output of the laser displacement sensor 5 will be −Zn+d+Z1+Nc+L1. Therefore, by moving the head section 4 with the Z-axially moving table 3 driven for the output of the laser displacement sensor 5 to be Lc, the nozzle clearance will be adjusted to the desired distance Nc in step 7.

Also, in the liquid application apparatus according to the embodiment 3, in case the reference surface 19a of the touch sensor 16 has been moved down over a distance d when the coordinate of the sub Z-axially moving table is SZn, the coordinate of the sub Z-axially moving table will be SZn−d in step 5 under the assumption that the distance from the laser displacement sensor 5 to the touch-sensor reference surface 19a is L1. Since the front end of the nozzle 9 touches the reference surface 19a at this time, the nozzle clearance will be adjusted to the desired distance Nc by moving the sub Z-axially moving table for the coordinate of the sub Z-axially moving table to be SZn−(L1−Lc)−Nc−d in step 7.

Further, in the liquid application apparatus according to the embodiment 4, in case the reference surface 19a of the touch sensor 16 has been moved down over a distance d when the coordinate of the sub Z-axially moving table 6 is SZn in step 5, the front end of the nozzle 9 touches the reference surface 19a when the coordinate of the sub Z-axially moving table 6 is SZn−d under the assumption that the distance to the reference surface 19a of the touch sensor 16 is L1. So, the nozzle clearance will be adjusted to the desired distance Nc in step 7 by moving the sub Z-axially moving table 6 for the coordinate of the sub Z-axially moving table 6 to be SZn−(L1−Lc)−Nc−d.

INDUSTRIAL APPLICABILITY

As having been described in the foregoing, the liquid application apparatus and nozzle clearance method according to the present invention are applicable to a liquid application apparatus for applying a liquid discharged from a nozzle to an object as well as to the fields of liquid crystal display, semiconductor device, etc.

The invention claimed is:

1. A method of adjusting a clearance between a nozzle mounted on a head and a work to a desired value in a liquid application apparatus wherein a liquid discharged from the nozzle is applied to the work, comprising:
    measuring a first distance, by using a non-contact distance sensor mounted on the head and positioned in parallel with the nozzle, from the non-contact distance sensor to a reference surface of a contact detection sensor detecting a contact of the nozzle front end with the reference surface opposite to the nozzle front end,
    contacting a nozzle by making contact with the nozzle front end and the reference surface of the contact detection sensor to obtain a positional information of the nozzle,
    relatively moving the head with respect to the contact detection sensor in a direction parallel to the reference surface between a relative position where the non-contact distance sensor is opposite to the reference surface and a relative position where the nozzle front end is opposite to the reference surface, the relative movement of the head being performed intermediate the measuring of the first distance and the contacting the nozzle, and wherein a point on the reference surface at which the non-contact distance sensor is opposite the reference surface and a point on the reference surface at which the nozzle front end is opposite the reference surface approximately coincide with each other,
    measuring a second distance, by the non-contact distance sensor, from the non-contact distance sensor to the work before applying the liquid to the work, and
    adjusting a nozzle clearance to a desired value based on the relative positional information between the nozzle and the non-contact distance sensor determined by the first distance measurement and the contacting the nozzle, and the distance determined by the second distance measurement.

2. A method of adjusting the nozzle clearance in the liquid application apparatus according to claim 1, the first distance measurement comprises adjusting a distance between the reference surface of the contact detection sensor and the non-contact distance sensor to a desired value.

3. A method of adjusting the nozzle clearance in the liquid application apparatus according to claim 2, wherein the distance between the reference surface of the contact detection sensor and the non-contact distance sensor is adjusted based on the measurement result of the distance from the non-contact distance sensor to the reference surface of the contact detection sensor by the non-contact distance sensor.

4. A method of adjusting the nozzle clearance in the liquid application apparatus according to claim 2, wherein the distance between the reference surface of the contact detection sensor and the non-contact distance sensor is adjusted by continuously measuring the distance from the non-contact distance sensor to the reference surface of the contact detection sensor by the non-contact distance sensor until the distance becomes to be a predetermined value.

5. A method of adjusting the nozzle clearance in the liquid application apparatus according to claim 1, wherein the positional information of the nozzle obtained by the contacting the nozzle is the coordinates value indicated by a moving unit, which relatively moves the nozzle and the reference surface of the contact detection sensor to each other.

6. A method of adjusting the nozzle clearance in the liquid application apparatus according to claim 5, wherein the positional information of the nozzle is the coordinates value of the moving unit at the time the contact detection sensor no longer detects the contact pressure of the nozzle front end or at the time the displacement of the reference surface becomes zero, after the reference surface of the contact detection sensor is moved by the contact pressure of the nozzle front end and then the displacement by the pressure is decreased.

7. A method of adjusting the nozzle clearance in the liquid application apparatus according to claim 5, wherein the moving unit comprises a device for moving the nozzle vertically.

8. A method of adjusting the nozzle clearance in the liquid application apparatus according to claim 5, wherein the moving unit comprises a device for vertically moving a head section having the nozzle and the non-contact distance sensor mounted thereon.

9. A method of adjusting the nozzle clearance in the liquid application apparatus according to claim 8, wherein the head section comprises at least one secondary moving unit to move vertically and separately the nozzle and/or the non-contact distance sensor, and the method comprises adjusting a vertical distance between the non-contact distance sensor and the nozzle by the secondary moving unit based on the relative positional relation between the non-contact distance sensor and the nozzle, after the first distance measurement and the contacting the nozzle.

10. A method of adjusting the nozzle clearance in the liquid application apparatus according to claim 5, wherein the first distance measurement comprises measuring a distance L1 to the reference surface of the contact detection sensor by the non-contact distance sensor, after positioning the non-contact distance sensor opposite to the reference surface of the contact detection sensor, and the contacting the nozzle comprises a step of measuring a position coordinate Zn of the moving unit when the nozzle front end is touched with the reference surface of the contact detection sensor by the operation of the moving unit, and the nozzle clearance is adjusted by the operation of the moving unit based on a relative positional relation between the nozzle and the non-contact distance sensor defined by the distance L1 from the non-contact distance sensor to the contact detection sensor and the position coordinate Zn of the moving unit which are determined by the first distance measurement and the contacting the nozzle.

11. A method of adjusting the nozzle clearance in the liquid application apparatus according to claim 10, wherein the first distance measurement comprises measuring a position coordinate Z1 of the moving unit at the time of measuring the distance to the reference surface of the contact detection sensor, and the nozzle clearance is adjusted by the operation of the moving unit based on the relative positional relation between the nozzle and the non-contact distance sensor defined by the position coordinates Z1 and Zn of the moving unit.

12. A method of adjusting the nozzle clearance in the liquid application apparatus according to claim 1, wherein the reference surface of the contact detection sensor is a movable surface moved by a contact pressure of the nozzle front end.

13. A method of adjusting the nozzle clearance in the liquid application apparatus according to claim 1, wherein the contact detection sensor is a sensor having a movable reference surface moved by a contact pressure of the nozzle front end and measuring a moving distance of the movable reference surface, and the contacting the nozzle comprises measuring a moving distance of the movable reference surface moved by the contact pressure of the nozzle front end, and the positional information obtained by the contacting the nozzle comprises the moving distance of the movable reference surface moved by the contact pressure of the nozzle front end.

14. A method of adjusting the nozzle clearance in the liquid application apparatus according to claim 1, wherein the relative positional information comprises a distance between the nozzle front end and the non-contact distance sensor.

15. A method of adjusting the nozzle clearance in the liquid application apparatus according to claim 1, wherein a distance between a position on the reference surface, corresponding to the point on the reference surface at which the non-contact distance sensor is opposite the reference surface, of the contact detection sensor measured by the non-contact distance sensor in the first distance measurement and a position of the nozzle front end, corresponding to the point on the reference surface at which the nozzle front end is opposite the reference surface, to be contacted in the contacting the nozzle is shorter than a distance between a position measured by the non-contact distance sensor and a position of the nozzle front end on a plane defined including the nozzle front end and parallel with the reference surface of the contact detection sensor.

16. A method of adjusting the nozzle clearance in the liquid application apparatus according to claim 1, wherein the distance is measured by irradiating a laser beam from the non-contact distance sensor to the reference surface of the contact detection sensor and by receiving the return light from the reference surface in the first distance measurement.

17. A method of adjusting the nozzle clearance in the liquid application apparatus according to claim 1, wherein the position of the contact detection sensor irradiated by the non-contact distance sensor in the first distance measurement is the same as the position of the nozzle front end to be contacted in the contacting the nozzle.

18. A method of adjusting the nozzle clearance in the liquid application apparatus according to claim 1, wherein the contacting the nozzle is conducted at each time of changing the nozzles.

* * * * *